United States Patent [19]

Schroeder et al.

[11] Patent Number: 5,216,405
[45] Date of Patent: Jun. 1, 1993

[54] PACKAGE FOR THE MAGNETIC FIELD SENSITIVE DEVICE

[75] Inventors: Thaddeus Schroeder, Rochester Hills; Bruno P. B. Lequesne, Troy, both of Mich.; Donald E. Lake, Kokomo, Ind.; John S. Zgunda, Muncie, Ind.; Daniel I. Feaster, Anderson, Ind.; George A. Shinkle, Luxembourg, Luxembourg; Robert W. Ward, Anderson, Ind.

[73] Assignees: General Motors Corporation, Detroit, Mich.; Delco Electronics Corp., Kokomo, Ind.

[21] Appl. No.: 640,774

[22] Filed: Jan. 14, 1991

[51] Int. Cl.⁵ .............................................. H01L 43/00
[52] U.S. Cl. ................................................. 338/32 R
[58] Field of Search ............. 338/32 R, 325 D, 32 H; 174/52.2, 52.3; 228/180.2; 29/744, 740; 357/74, 27, 84; 324/117 R, 117 H, 207.21

[56] References Cited

U.S. PATENT DOCUMENTS

| | | | |
|---|---|---|---|
| 3,943,481 | 3/1976 | Masuda et al. | 338/32 R |
| 4,584,552 | 4/1986 | Suzuki et al. | 338/32 H |
| 4,859,941 | 8/1989 | Higgs et al. | 338/32 H |
| 4,926,154 | 5/1990 | Heremans et al. | 338/32 R |
| 4,937,521 | 6/1990 | Yoshino et al. | 324/117 R |
| 4,953,002 | 8/1990 | Nelson et al. | 357/74 |
| 4,972,241 | 11/1990 | Fukuda et al. | 338/32 H X |
| 5,023,684 | 6/1991 | Tsunoda | 357/27 |

*Primary Examiner*—Marvin M. Lateef
*Attorney, Agent, or Firm*—Robert J. Wallace

[57] ABSTRACT

A package for a magnetic field sensitive element, such as a magnetoresistor, includes at least two planar layers of a relatively stiff ferromagnetic material which is also electrically conductive. The layers have opposed edges which are in closely spaced relation to form a narrow gap therebetween. A terminal tab is integral with and extends from each layer. A magnetic field sensitive element is on a surface of at least one of the layers and preferably extends across the gap to be on both layers. The magnetic field sensitive element has a pair of contacts each of which is electrically connected to a separate one of the layers. A permanent magnet is mounted on and insulated from the surface of the layers opposite the magnetic field sensitive element. A protective layer of an insulating material may cover the magnetic field sensitive element and the layers with the terminal tabs extending therefrom.

28 Claims, 7 Drawing Sheets

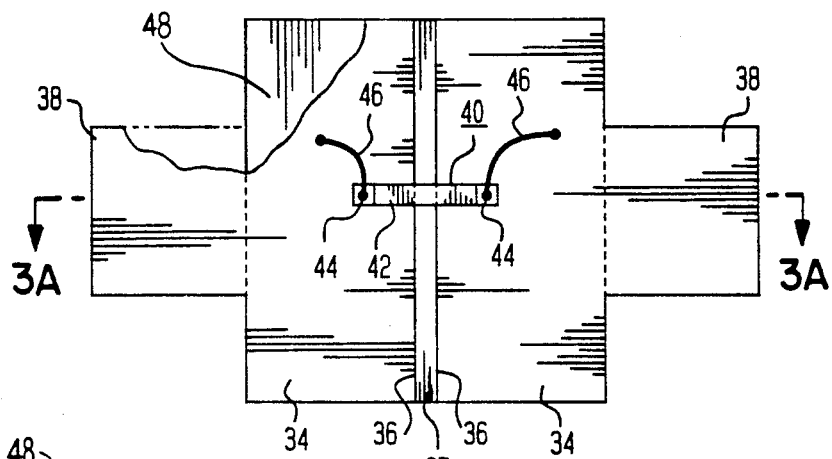
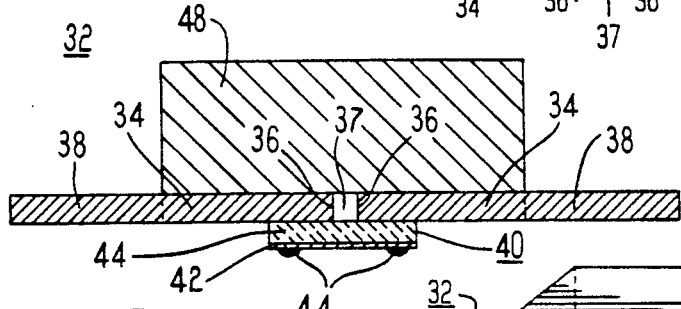
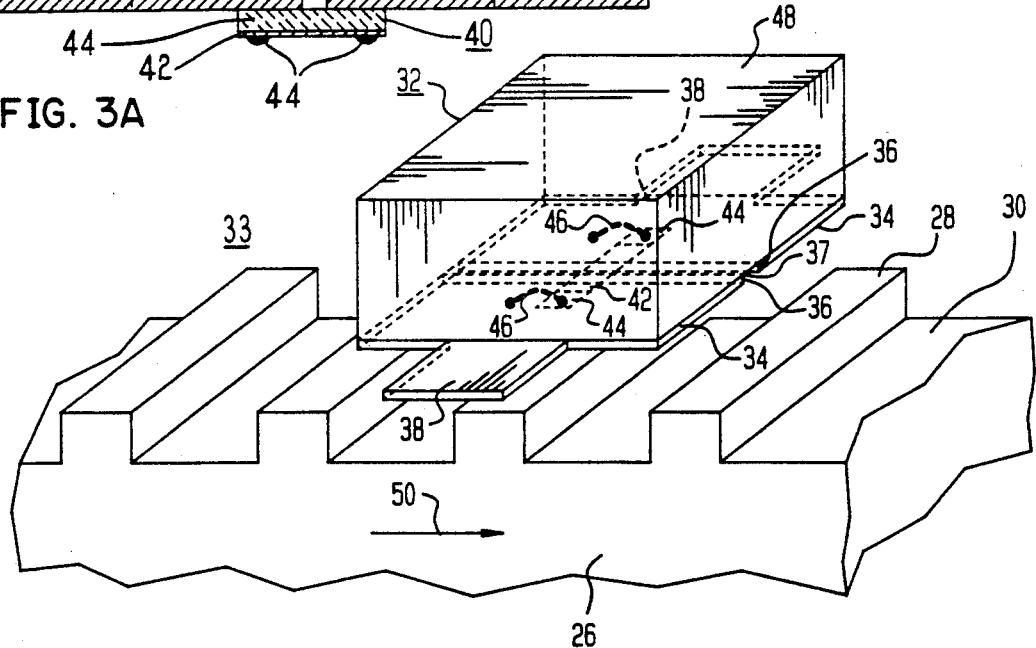

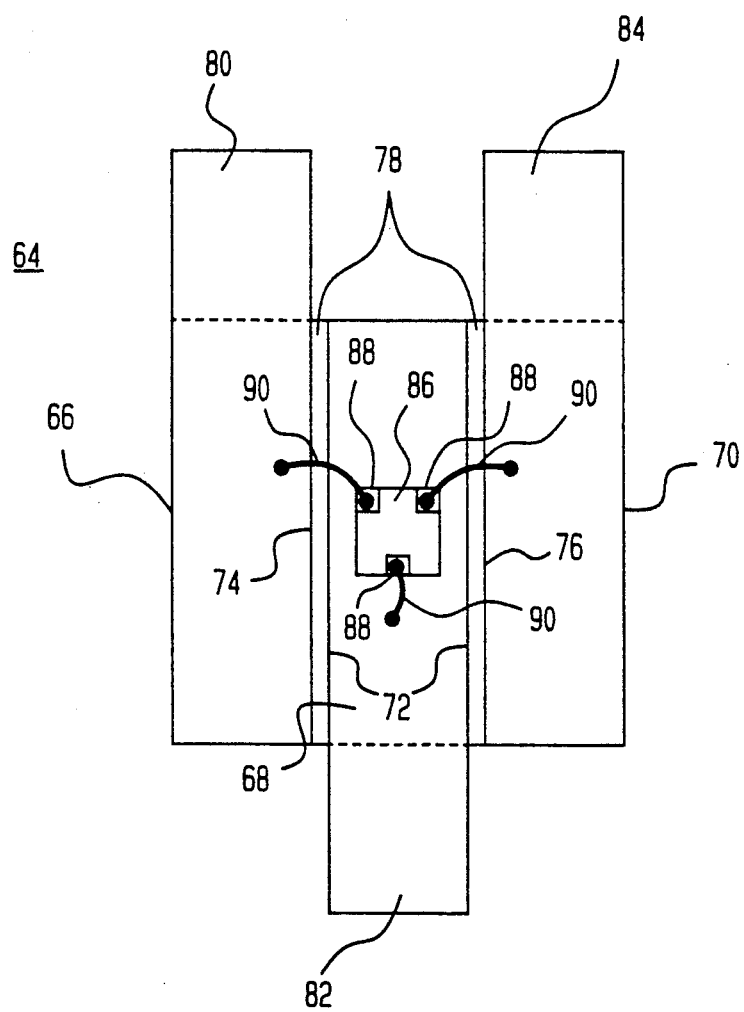

5,216,405

PACKAGE FOR THE MAGNETIC FIELD SENSITIVE DEVICE

FIELD OF THE INVENTION

The present invention relates to a package for a magnetic field sensitive device, such as a magnetoresistor or Hall effect device, and, more particularly, to a planar package which is made up of relatively few parts and is easy to assemble.

BACKGROUND OF THE INVENTION

A magnetoresistor is a device whose resistance varies with a magnetic field applied to the device and is therefore useful as a magnetic field sensor. Thus, the magnetoresistor is useful as a speed or position sensor. One form of a magnetoresistor is a thin body of a high carrier mobility semiconductor material, such as indium antimonide (InSb) or indium arsenide (InAs) having contacts at its ends. However, a preferred form of a magnetoresistor is formed of a thin film of the semiconductor material and is described in detail in U.S. Pat. No. 4,926,154 (J. P. Heremans et al., issued May 15, 1990) entitled, "Indium Arsenide Magnetoresistor." This form of the magnetoresistor comprises a substrate of an insulating semiconductor material having a thin film of the magnetoresistor material on a surface thereof in the form of a narrow strip. Conductive contacts are formed at the ends of the magnetoresistor material strip.

To use the magnetoresistor as a speed or position sensor, it has been mounted in a magnetic circuit which includes a permanent magnet on which the magnetoresistor element is mounted and an exciter. The exciter is a high magnetic permeability element with a series of spaced teeth separated by slots that moves in relation to the stationary magnetoresistor element for changing the reluctance of the magnetic circuit and for causing the magnetic flux through the sensing element to vary in a fashion corresponding to the position of the teeth. The magnetoresistor element and the permanent magnet are generally formed into a single sensor package to allow for ease of mounting the package over the exciter. Referring to FIG. 1, there is shown a perspective view of a form of a magnetoresistor sensor package 10 which has been found suitable for providing a device having a high magnetic sensitivity. This sensor package and how it is used in a magnetic circuit is described in detail in U.S. Pat. No. 4,926,122 (T. Schroeder et al., issued May 15, 1990) entitled, "High Sensitivity Magnetic Circuit." The magnetoresistor sensor package 10 comprises a permanent magnet 12 having a planar surface 14 which is coated with a layer 16 of a high permeability magnetic metal, such as iron, hereinafter referred to as a ferromagnetic layer. The ferromagnetic layer 16 is covered by a layer 18 of an electrical insulating material, such as a plastic. Spaced bonding pads 20 of an electrically conductive material are on the insulating layer 18. A magnetoresistor element 22 is mounted on the insulating layer 18 between the bonding pads 20 with the contacts, not shown, of the magnetoresistor element 22 contacting and electrically connected to the bonding pads 20. Terminal wires 24 are electrically connected to the bonding pads 20 and extend from the package 10. If desired, a protective covering of an insulating material, such as a plastic, may be molded over the magnetoresistor element 22 and at least a portion of the permanent magnet 12.

Referring to FIG. 2, there is shown a magnetic circuit 25 comprising the magnetoresistor sensor package 10 of FIG. 1 and an exciter 26. The exciter 26 is a wheel having spaced teeth 28 with slots 30 therebetween. The magnetoresistor element 22 is in the form of a narrow strip mounted on the center line of the ferromagnetic layer 18 and positioned so as to be parallel to the teeth 28 and the slots 30 of the exciter wheel 26. The width of the magnetoresistor sensor element 22, as well as that of the magnet 12, are very important design parameters governing the sensitivity of the sensor and are described in detail in U.S. Pat. No. 4,926,122. The length of the magnetoresistor sensor element 22 is selected to provide a sufficiently large active surface for the required resistance and power dissipation. Theoretically, the length of the magnetoresistor element 22 is limited only by the magnet size. However, in order to minimize the influence of the magnetic end effects, the ends of the magnetoresistor element 22 are not located too close to the edges of the magnet 12.

As described in U.S. Pat. No. 4,926,122, in the operation of the magnetic circuit, the magnetic flux density distribution changes as the exciter 26 moves across the magnetoresistor sensor element 22. The magnetic flux density distribution in the magnetoresistor sensor element 22 has a peak value when a tooth 28 is aligned with the magnetoresistor sensor element 22 and a valley when a slot 30 is aligned with the magnetoresistor sensor element 22. As the exciter 26 moves, the peaks and valleys follow the exciter teeth 28 and slots 30 creating a traveling wave of flux density along the width of the sensor element 22. This yields an output from the magnetoresistor sensor element 22 which indicates position or speed. The ferromagnetic layer 16 of the package 10 serves to enhance the contrast between the peaks and valleys in the magnetic flux density distributions.

Although the magnetoresistor sensor package 10 provides a sensor having good sensitivity, it has the disadvantage that it is formed of a number of different parts and requires a number of different operations to assemble. For large-scale manufacturing operations, it would be desirable to form such a package from fewer parts which can be assembled by fewer operations. This would reduce the assembly time and the overall cost of the package.

SUMMARY OF THE INVENTION

The present invention is directed to a package for a magnetic field sensitive device comprised of a layer of magnetic material which is also electrically conductive and which is split so as to provide at least two parts having closely spaced edges. The layer has terminals projecting from the parts. A magnetic field sensitive element is mounted on a surface of at least one of the parts with contacts on the element being electrically connected to separate one of the parts. A permanent magnet may be secured to and electrically insulated from the surface of the parts of the layer opposite the element. If desired, a protective coating may be molded around the element, the layer and at least a portion of the magnet with the terminals projecting therefrom.

More particularly, the package of the present invention comprises a pair of planar layers of a magnetic material which is electrically conductive. The layers have edges which are in closely spaced relation to provide a narrow gap therebetween. The layers have terminals extending therefrom. A magnetic field sensitive element is on at least one of said layers. The element comprises an active region of magnetoresistive material and spaced contacts on the active region. Means is provided which electrically connects each of the contacts of the element to a separate one of the planar layers.

The invention will be better understood from the following more detailed description taken with the accompanying drawings.

BRIEF DESCRIPTION OF THE DRAWINGS

FIG. 3 is a top view of one form of a magnetoresistor sensor package in accordance with the present invention.

FIG. 3A is a sectional view through the sensor element area of FIG. 3.

FIG. 4 is a perspective view of a magnetic circuit using the magnetoresistor sensor element shown in FIG. 3.

FIG. 11 is a top plan view of a three-terminal magnetoresistor sensor package in accordance with the present invention.

Figure 1:
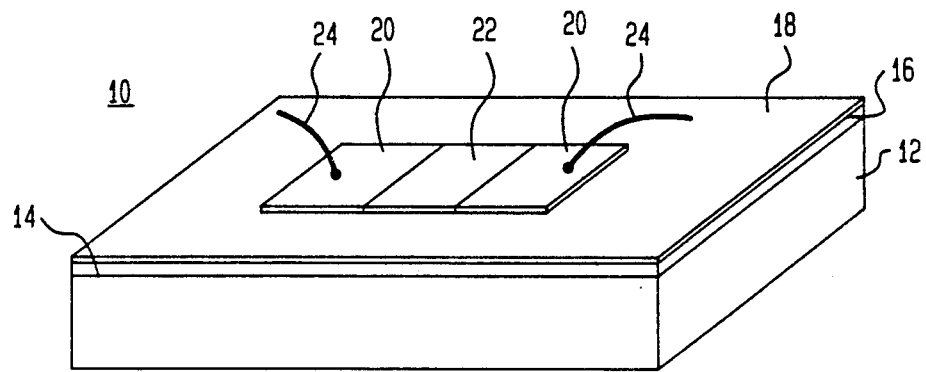
FIG. 1 is a perspective view of a prior art magnetoresistor sensor.
Figure 2:
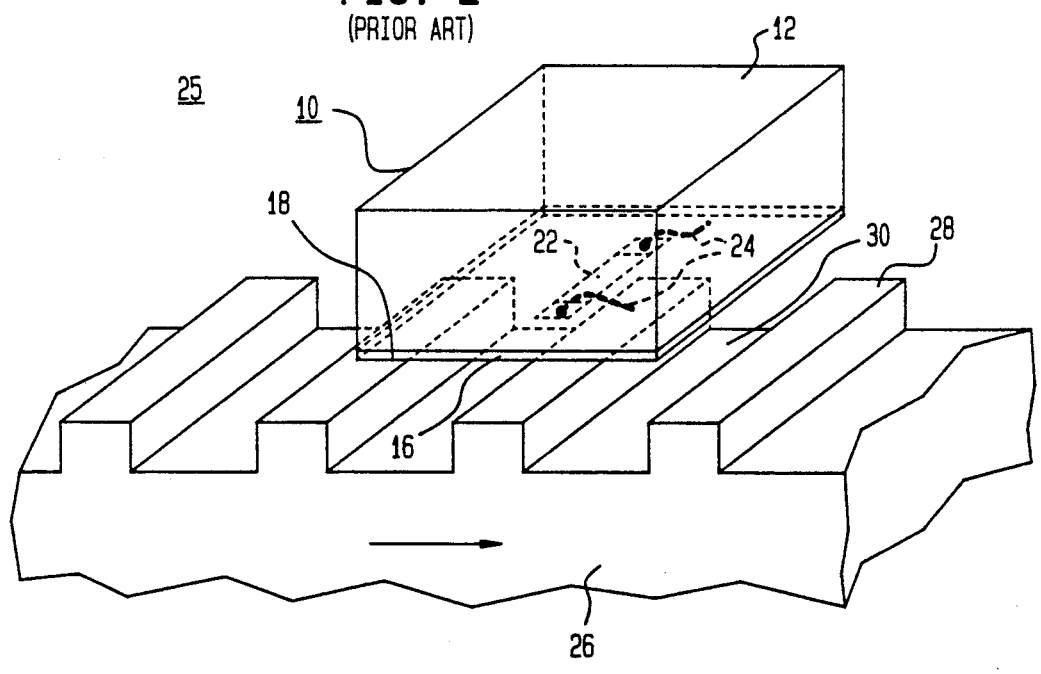
FIG. 2 is a perspective view of a prior art magnetic circuit assembly using the magnetoresistor sensor shown in FIG. 1.

It should be understood that the drawings are all not necessarily drawn to scale.

DETAILED DESCRIPTION

Referring now to FIGS. 3 and 4, there is shown respectively a top plan view of a magnetoresistor sensor package 32 in accordance with the present invention and a perspective view of the package 32 in a magnetic circuit 33. The magnetoresistor sensor package 32 comprises a pair of planar layers 34 of a ferromagnetic material having opposed edges 36 which are in closely spaced relation so as to provide a very narrow gap 37 therebetween. The gap 37 should be as narrow as practically possible so as to provide a very narrow air gap. However, if desired, the gap 37 can be filled with an electrically non-conductive magnetic material, such as an epoxy filled with iron particles. The layers 34 are of a ferromagnetic material which is also electrically conductive and have terminal tabs 38 integral therewith and extending therefrom. The terminal tabs 38 project in opposite directions from the layers 34, which, as shown, are in a direction away from the opposed edges 36. The layers 34 are preferably made of a relatively stiff material, such as the glass sealing alloy "42" made by the Carpenter Steel Corporation which consists of by weight 40% to 42% nickel and the rest substantially iron. The magnetic properties of this material are similar to those of iron and its coefficient of thermal expansion is close to that of indium antimonide and indium arsenide, which are the preferred materials for the magnetoresistor element.

A magnetoresistor element 40 is mounted on and bonded to the layers 34. The magnetoresistor element 40 is in the form of an elongated strip and, as described in U.S. Pat. No. 4,926,154, comprises a substrate of an insulating material, such as gallium arsenide, having on a surface thereof a thin active layer 42 of a magnetoresistor material, such indium antimonide or indium arsenide. Electrically conductive contacts 44 are on the active layer 42 at ends thereof. The magnetoresistor element 40 is mounted on both of the layers 34 so as to extend across the gap 37 between the edges 36. The magnetoresistor element 40 is preferably in the center of the layers 34 and extends substantially perpendicular to the edges 36. As shown, each of the contacts 44 is electrically connected to a separate one of the layers 34 by a connecting wire 46. However, the magnetoresistor element 40 may be mounted on the layers 34 with the contacts 44 being in direct contact with and bonded to the layers 34 so as to eliminate the connecting wires 46. In this arrangement, the active layer 42 of the magnetoresistor element 40 should be coated with an insulating material so as to insulate the active layer 42 from the layers 34.

As shown in FIG. 4, a permanent magnet 48 is mounted on the sides of the layers 34 opposite the magnetoresistor element 40. The permanent magnet 48 is of a size substantially no greater than the combined areas of the layers 34 so that the terminal tabs 38 project beyond the permanent magnet 48. The permanent magnet 48 is bonded to the layers 34 by an electrically insulating bonding material (not shown) so as to electrically isolate the permanent magnet 48 from the layers 34. This type of insulating layer is illustrated as layer 16 in FIG. 1. If desired, a protective coating of an insulating material (not shown) may be coated or molded over the layers 34, magnetoresistor element 40 and the sides of the permanent magnet 48.

The magnetoresistor sensor package 32 is formed of a minimum number of parts (i.e., the ferromagnetic layers 34, the magnetoresistor element 40 and the permanent magnet 48) so as to be relatively inexpensive to manufacture. In the package 32, the ferromagnetic layers 34 serve the dual function of enhancing the magnetic sensitivity of the sensor, and providing the electrical connections to the magnetoresistor sensor element 40. Although the terminal tabs 38 are shown as projecting outwardly away from the sides of the permanent magnet 48, they can be bent in various manners as desired. However, they should not be bent to extend along and close to the sides of the permanent magnet since they could partially short-circuit the magnet and thereby lower the magnitude of the available magnetic field intensity.

The magnetoresistor sensor package 32 is used in a magnetic circuit by mounting it over an exciter 26 as shown in FIG. 4. In order to enjoy the full benefit of the ferromagnetic layer 34, the gap 37 between the edges 36 of the layers 34 must be as narrow as possible. Preferably, the gap 37 should also be oriented in such a way as not to interfere with the propagation of the traveling flux density wave. This means that the gap 37 should be oriented so that the traveling wave does not have to move across it. This is accomplished, as shown in FIG. 4, by having the edges 36 of the ferromagnetic layers 34 oriented in the direction of movement of the exciter 26 which is indicated by the arrow 50. Since the magnetoresistor sensor element 40 extends across the gap 37 between the edges 36 of the ferromagnetic layers 34, the portion of the magnetoresistor element 40 over the gap does not fully benefit from the magnetic flux density enhancement provided by the ferromagnetic layers 34 so that there might be some decrease in the overall magnetic circuit sensitivity. However, this effect can be minimized by making the magnetoresistor element 40 much longer than the width of the gap 37.

Figure 5:
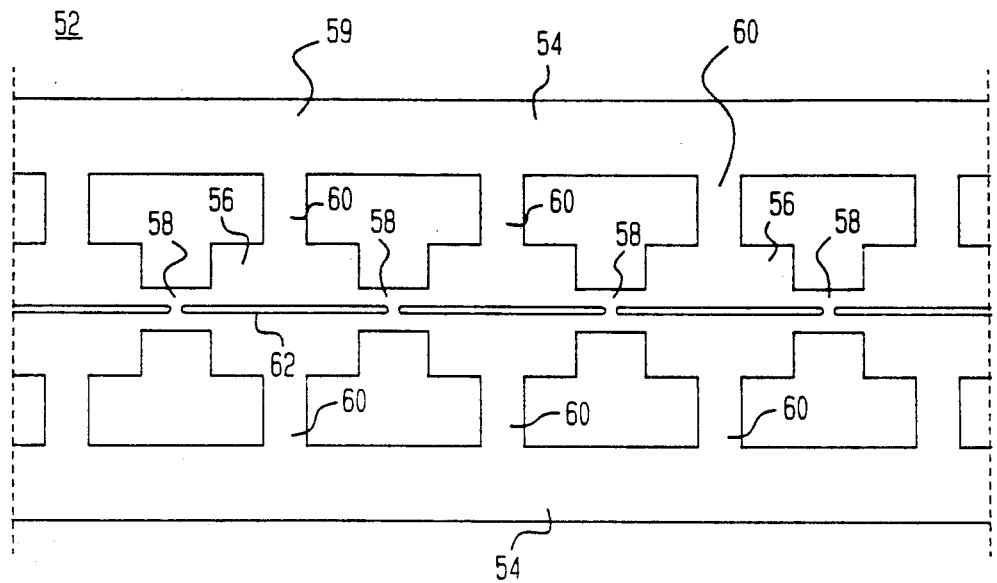
FIG. 5 is a top plan view of a lead frame which can be used to make the magnetoresistor sensor package shown in FIG. 3.

One method of making the ferromagnetic layers 34 is in the form of a lead frame 52 as shown in FIG. 5. The lead frame 52 is an elongated flat strip of the ferromagnetic material having narrow side strips 54 extending along the elongated sides of the lead frame 52. A plurality of square areas 56 are arranged in spaced relation between and parallel to the side strips 54. The square areas 56 are connected together by connecting strips 58 which extend between the square areas 56 substantially parallel to the side strips 54. Each of the square areas 56 is connected to the side strips 54 by connecting strips 60 which extend between the square areas 56 and the side strips 54 substantially perpendicular to the side strips 54. The result can be considered to be pairs of opposed T-shaped slots 57 extending along the length of the lead frame 52. Each of the square areas 56 has a narrow slit 62 therethrough extending across the square area 56 substantially parallel to the side strips 54 and into the connecting strips 58.

Figure 6:
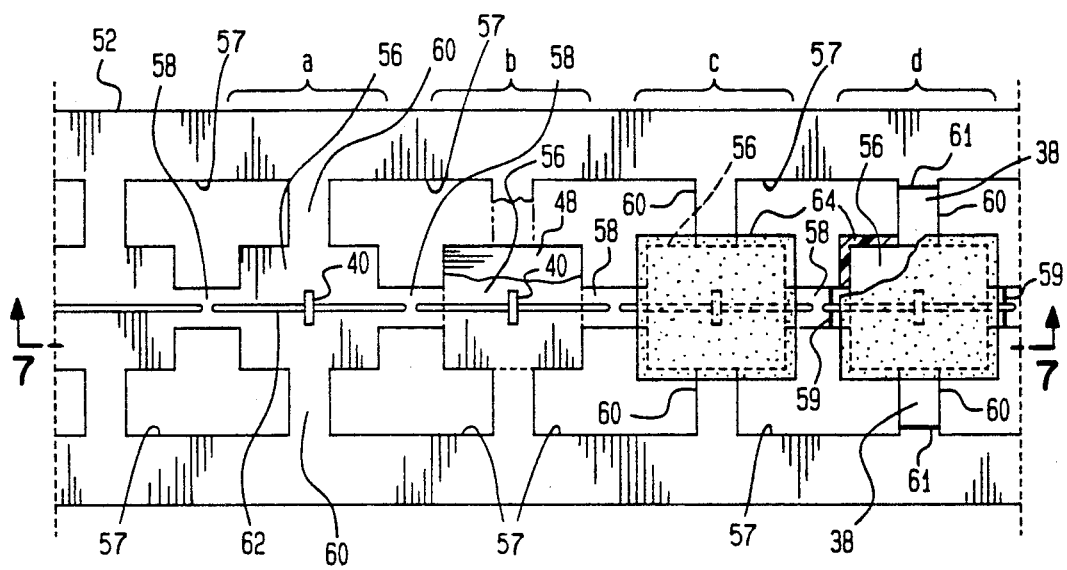
FIG. 6 is a top plan view illustrating the steps of making the magnetoresistor sensor package shown in FIG. 3.
Figure 7:
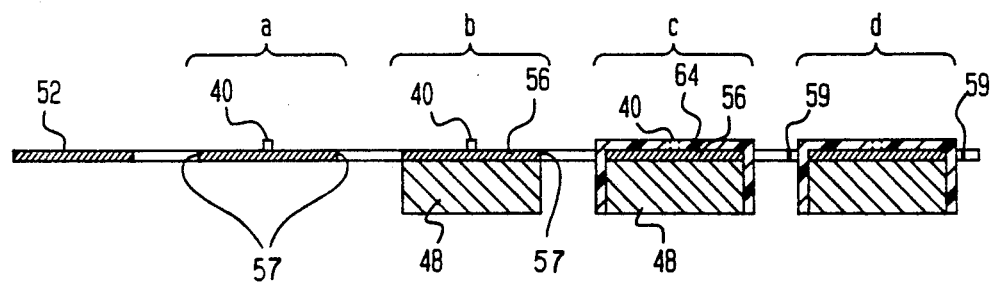
FIG. 7 is a sectional view taken along line 7—7 of FIG. 6.

Referring now to FIGS. 6 and 7, there is shown a top view and sectional view, respectively, of the lead frame 52 illustrating the steps of a method of making a magnetoresistor sensor package 10 of the present invention with the lead frame 52. This method comprises first mounting a magnetoresistor sensor element 40 on one surface of each of the square areas 56 with the sensor element 40 extending across the slit 62 as shown at position a. The contacts 44 of the sensor element 40 (not shown in FIGS. 6 and 7) are electrically connected to the square areas 56 either by terminal wires or by being bonded directly to the square areas 56. A permanent magnet 48 is then mounted on and bonded to the other surface of each of the square areas 56 as shown at position b in FIG. 7. As shown at position c, a protective coating 64 of an insulating material, such as a plastic, is then molded or coated over the magnetoresistor sensor element 40, the square area 56 and the sides of the permanent magnet 48. This protects the magnetoresistor sensor element 40 and helps hold the parts together. As indicated at position d, the connecting strips 58 and 60 are cut transversely thereacross to separate the package 10 from the lead frame 52. The connecting strips 58 are cut at the ends of the slits 62 along the lines 59 so as to electrically separate the square area 56 into the two layers 34. The connecting strips 60 are cut at their junctions with the side strips 54 along the lines 61 so as to form the terminal tabs 38 of the package 10.

Although the magnetoresistor sensor package 10 has been described as being formed with the permanent magnet 48 being mounted on the layer 34 before the protective coating is applied thereto, the package 10 can be made without the permanent magnet 48. In this case, the magnetoresistor sensor element 40 is mounted on the layers 34 and the contacts 44 electrically connected to the layers 34. The protective coating is then molded or coated over the magnetoresistor sensor element 40 and one side of the layers 34. If the layers 34 are part of a lead frame 52, the connecting strips 58 and 60 are then cut to separate the package 10 from the lead frame 52. The permanent magnet 48 is to be mounted on the other surface of the layer 34 later either by the manufacturer or by the user. Magnetization of the permanent magnet 48 can be performed before or after assembly of the package, or in between any two stages of the assembly process.

Although the magnetoresistor sensor package 10 has been described with the magnetoresistor sensor element 40 being mounted on the ferromagnetic layers 34 so that it extends across the gap 37 between the edges 36 of the layers 34, it is not necessary that the magnetoresistor sensor element 40 extend across the gap 37.

Figure 8:
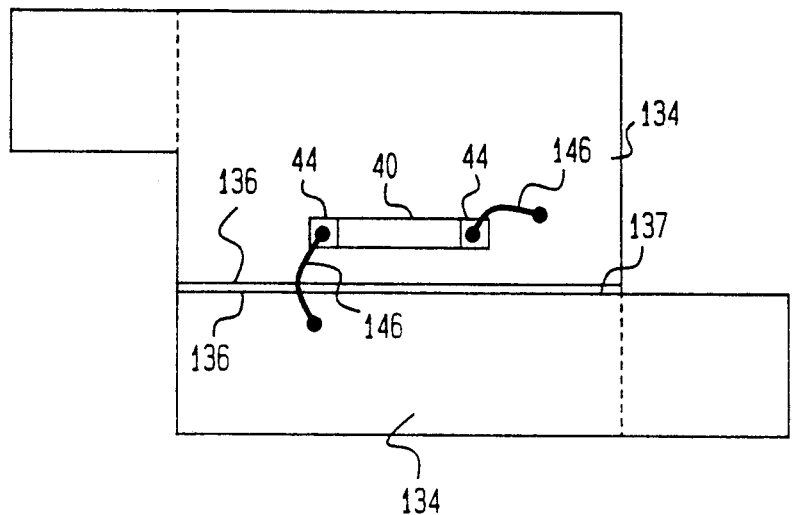
FIG. 8 is a top plan view of another magnetoresistor sensor package in accordance with the present invention.

Referring now to FIG. 8, there is shown a top plan view of a magnetoresistor sensor package 132 in accordance with the present invention. A magnetoresistor sensor element 40 is mounted on one of a pair of ferromagnetic layers 134 which have spaced edges 136 forming gap 137 therebetween. Contacts 44 of the magnetoresistor sensor element 40 are each electrically connected to a separate one of the ferromagnetic layers 134 by a separate terminal wire 146. When the magnetoresistor sensor package 132 is used in a magnetic circuit, it is best to have the gap 137 extend in the direction of movement of an exciter, such as exciter 26 of FIG. 4. However, mounting the package 132 with the narrow gap 137 perpendicular to the exciter direction of movement is acceptable for some applications.

Figure 9:
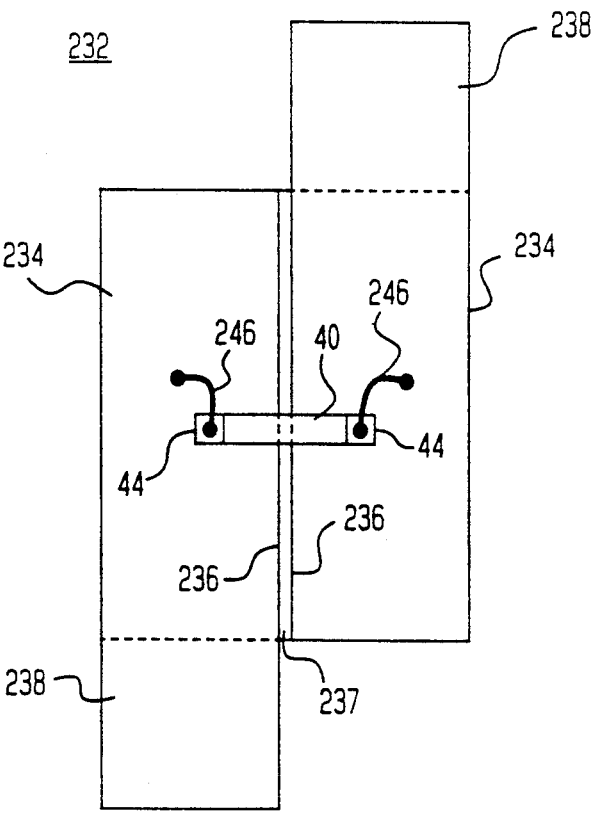
FIG. 9 is a top plan view of still another magnetoresistor sensor package in accordance with the present invention.
Figure 10:
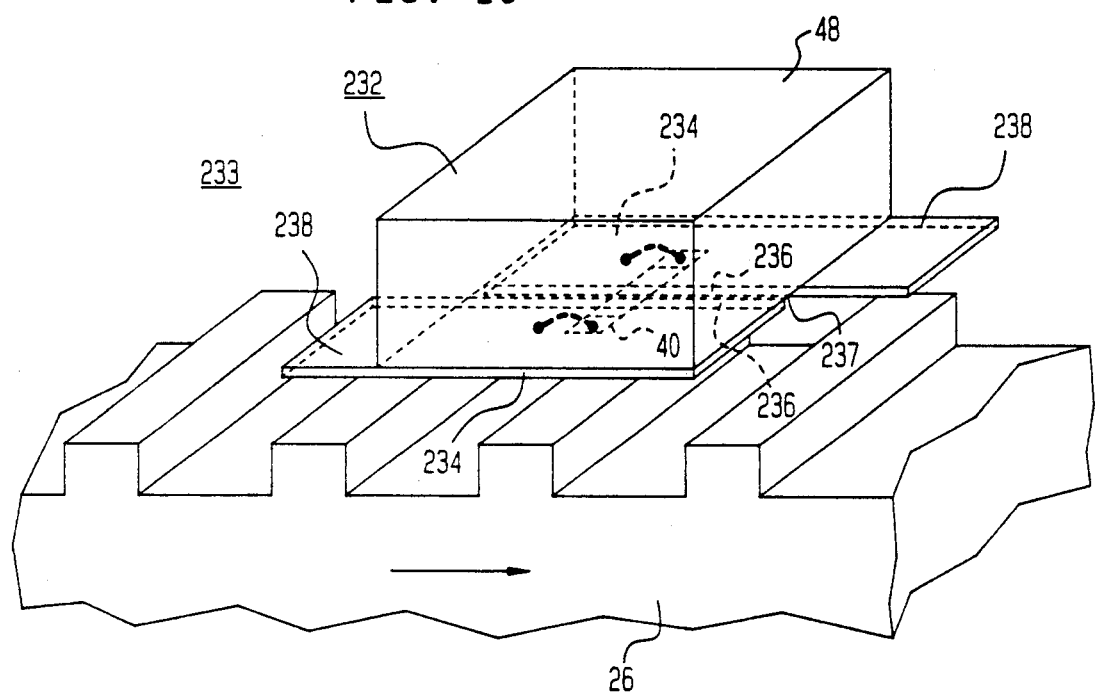
FIG. 10 is a perspective view of a magnetic circuit using the magnetoresistor sensor package shown in FIG. 9.

Referring now to FIGS. 9 and 10, there are respectively shown a top plan view of a magnetoresistor sensor package 232 in accordance with the present invention, and a perspective view of the package 232 in a magnetic circuit 233. The package 232 comprises a pair of ferromagnetic layers 234 having edges 236 in closely spaced relation to provide a narrow gap 237 therebetween. Terminal tabs 238 are integral with and extend from an end of each layer 234 substantially parallel to the edges 236. The terminal tabs 238 extend in opposite directions from the layers 234. A magnetoresistor sensor element 40 is mounted on the ferromagnetic layers 234 and extends across the gap 237. Contacts 44 of the magnetoresistor sensor element 40 are electrically connected to the ferromagnetic layers 234 by separate terminal wires 246.

As shown in FIG. 10, a permanent magnet 48 is mounted on the surface of the ferromagnetic layers 234 opposite the magnetoresistor sensor element 40. When the package 232 is used in the magnetic circuit 233, as shown in FIG. 10, the package 232 is mounted over an exciter 26 with the gap 237 between the ferromagnetic layers 234 being aligned with the direction of movement of the exciter 26. Thus, the terminal tabs 238 will also extend in the direction of the movement of the exciter 26.

Although the magnetoresistor sensor package of the present invention has been described as being a two-terminal device, it can be a multiple terminal device. A multiple terminal package would be useful for dual magnetoresistors which have three terminals.

Referring now to FIG. 11, there is shown a top plan view of a three-terminal magnetoresistor sensor package 64 in accordance with the present invention. The magnetoresistor sensor package 64 comprises three planar ferromagnetic layers 66, 68 and 70 arranged in parallel relation with the layer 68 being positioned between the layers 66 and 70. The intermediate layer 68 has opposed edges 72 which are closely spaced from edges 74 and 76 of the layers 66 and 70, respectively, to form first and second narrow gaps 78 therebetween. Terminal tabs 80, 82 and 84 are integral with and extend from an end of the layers 66, 68 and 70, respectively. The terminal tabs 80, 82 and 84 extend parallel to the gaps 78 with the terminal tab 82 extending from the intermediate layer 68 in a direction opposite that which the terminal tabs 80 and 84 extend from their respective layers 66 and 70.

A magnetoresistor sensor element 86 having three contacts 88 is mounted on a surface of the intermediate layer 68. Each of the contacts 88 is electrically connected to a separate one of the layers 66, 68 and 70 by a separate one of terminal wires 90. A permanent magnet (not shown) is secured to the surface of the layers 66, 68 and 70 opposite the magnetoresistor sensor element 86. If desired, a protective coating (not shown) may be molded or coated over the magnetoresistor element 86, one surface of the layers 66, 68 and 70 and the sides of the permanent magnet. In the use of the magnetoresistor sensor package 64 in a magnetic circuit (not shown), the package 64 is mounted over an exciter wheel (not shown) with the gaps 78 extending preferably in the same direction as the movement of the exciter wheel. The terminal tabs 82, 84 and 86 also extend in the same direction as the movement of the exciter.

Figure 12:
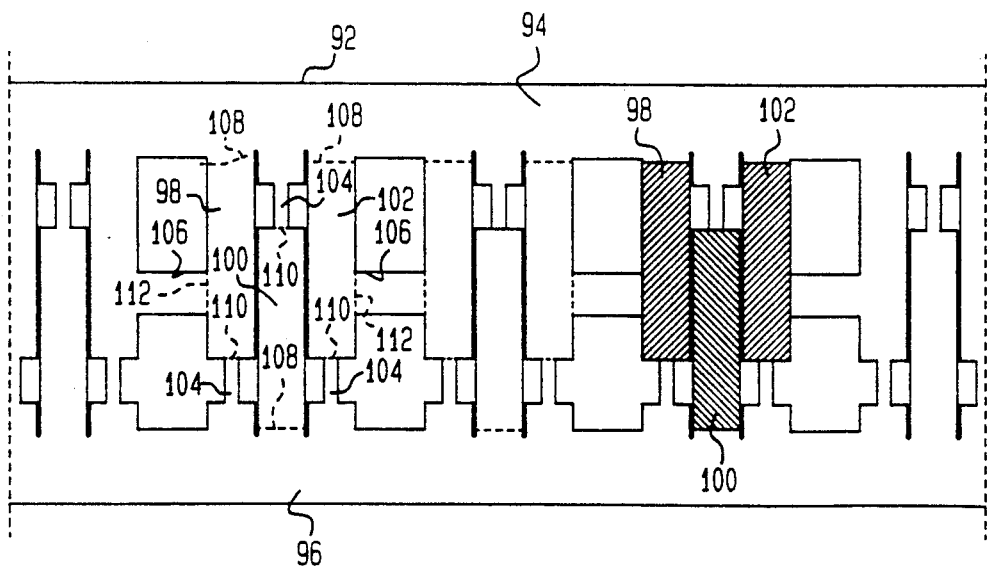
FIG. 12 is a top plan view of a lead frame which can be used to form the magnetoresistor sensor package shown in FIG. 11.

The ferromagnetic layers 66, 68 and 70 and their terminal tabs 80, 82 and 84 may be formed from a lead frame, such as the lead frame 92 shown in FIG. 12. Referring now to FIG. 12, there is shown the lead frame 92 which comprises a pair of spaced, parallel side strips 94 and 96 having groups of three parallel strips 98, 100 and 102 extending between the side strips substantially perpendicular thereto with a narrow gap between adjacent strips. Only three complete groups of the three parallel strips 98, 100 and 102 are shown. The right end group is shown with cross-section lines through each of the strips to make the identification of the groups easier to see. Each of the outer strips 98 and 102 of each group is connected at one end directly to the side strip 94 and at its other end to the side strip 96 through a narrow connecting strip 104. The intermediate strip 100 of each group is connected at one end directly to the side strip 96 and at its other end to the side strip 94 through a narrow connecting strip 104. Each of the outer strips 98 and 102 is connected to an outer strip of an adjacent group through a connecting strip 106.

The magnetoresistor sensor package 64 of FIG. 11 is made using the lead frame 92 by first mounting a magnetoresistor sensor element 86 on one surface of the intermediate strip 98 of a group of strips comprising strips 98, 100 and 102. The contacts 88 of the magnetoresistor sensor element 86 are electrically connected to the strips 96, 98 and 100 by terminal wires 90. If desired, a permanent magnet can be secured to the sides of the strips 96, 98 and 100 opposite the magnetoresistor sensor element 86. A protective coating can be molded or coated over the magnetoresistor sensor element 86 and one side of the strips 96, 98 and 100 along with the sides of the permanent magnet if present. The strips 96, 98 and 100 are then cut along their junctions with the side strips 94 and 96 and the connecting strips 104 as indicated by the dash lines 108 and 110 and the outer strips 96 and 100 are cut along their junctions with the connecting strips 106 as indicated by the dash lines 112 to separate the package 64 from the lead frame 92.

Thus, there is provided by the present invention a magnetoresistor sensor package which is made up of a minimum number of parts so as to be relatively easy to assemble and relatively inexpensive. In the package of the present invention the ferromagnetic layers serve a dual function of enhancing the magnetic sensitivity of the magnetoresistor sensor element and providing the electrical terminals for the magnetoresistor sensor element. In addition, the ferromagnetic layers can be formed as part of a lead frame which supports the magnetoresistor sensor element and the permanent magnet during the assembly of the package. This further simplifies the assembly of the package.

It is to be appreciated and understood that the specific embodiments of the invention are merely illustrative of the general principles of the invention. Various modifications may be made consistent with the principles set forth. For example, although the package has been described in detail as being a package for a magnetoresistor element, it can be used for any type of magnetic field sensitive device, such as a Hall effect device, magnetodiode or the like. The three-terminal package shown in FIG. 11 is most useful for a Hall effect device, which is a three-terminal device. Also, although the package has been shown as having two or three terminals, it can have any desired number of terminals. The ferromagnetic layers can be made of any material having magnetic properties and which is electrically conductive. As previously stated, the package can be made with or without the permanent magnet attached to the ferromagnetic layers. If it is made initially without the permanent magnet, the permanent magnet can be attached later by either the manufacturer or the user of the package. Although the magnetoresistor sensor element has been described as being of a layer of a semiconductor material on a substrate, it can be of any well-known structure for a magnetoresistor sensor element.

The embodiments of the invention in which an exclusive property or privilege is claimed are defined as follows:

1. A package for a magnetic field sensitive device comprising:
   a permanent magnet having a planar major surface;
   a pair of coplanar members of a magnetic and electrically conductive material having their major faces dispersed on said magnet major surface, said members having facing edges which are in closely spaced from one another, to provide a narrow gap therebetween, effective to provide a substantially complete ferromagnetic covering on said magnet major face and two electrically isolated sites for making electrical contact with a magnetic field sensitive element to be mounted on outer major faces of said members;
   a terminal tab integral with each of said members and extending away from said gap;
   dielectric means disposed between said magnet and said members for preventing a low electrical resistance path between said members on said magnet surface,
   a magnetic field sensitive element on an outer major face of at least one of said members, said element having an active region of a magnetic field sensitive material and spaced contacts on the active region; and means electrically connecting each of the element contacts to a separate one of the members, effective to provide a magnetic field sensitive device that can exhibit a travelling wave of higher intensity magnetic flux across the faces of said coplanar members, and also have integral connection tabs for making electrical connection to said device.

2. The package of claim 1 in which the magnetic field sensitive element extends across the gap between the elements and is disposed on both of said members.

3. The package of claim 2 in which the magnetic field sensitive element has a width of the order of the gap between said members, has a length substantially greater than its width, and has contacts at opposite ends of the length of the element.

4. The package of claim 3 in which the magnetic field sensitive element is a magnetoresistor comprising a layer of a magnetoresistive semiconductor material on a substrate and spaced contacts on said layer.

5. The package of claim 4 in which one terminal wire electrically connects the contact at one end of the element to one coplanar member and a second terminal wire electrically connects the contact on the opposite end of the element to the other coplanar member.

6. The package of claim 4 in which the magnetoresistor element is mounted on the coplanar members with the contacts directly engaging the layers so as to be electrically connected thereto.

7. The package of claim 3 in which each terminal tab extends from the edge of its respective member which is opposite the facing edges of the, effective to form opposed contact tabs for said device.

8. The package of claim 3 further comprising a protective layer of an insulating material covering the magnetic field sensitive element and the outer faces of the coplanar members.

9. The package of claim 3 further comprising a protective layer of an insulating material covering the magnetic field sensitive element, the outer faces of the coplanar members and the sides of the permanent magnet.

10. The package of claim 3 in which the coplanar members and their integral terminal tabs are of a relatively stiff ferromagnetic material.

11. The package of claim 3 in which the terminal tabs extend from their respective layers substantially parallel to the major surface of said magnet.

12. The package of claim 11 further comprising a protective layer of an insulating material covering the magnetic field sensitive element, the coplanar members and the sides of the permanent magnet.

13. The package of claim 1 in which the terminal tabs extend from their respective members in opposite directions but substantially parallel to the major face of the members.

14. The package of claim 1 in which the magnetic field sensitive element is mounted on only one of the members but adjacent said gap and electrically connected to the other of said members by means of a terminal wire.

15. The package of claim 1 comprising three parallel coplanar members with a middle member having opposed edges, each of which is closely spaced from a facing edge of a separate one of the other members so as to form narrow gaps between the members, the magnetic field sensitive element has three contacts and each of the contacts is electrically connected to a separate one of the members.

16. The package of claim 15 in which the magnetic field sensitive element is mounted on the middle layer.

17. The package of claim 16 in which each member has an integral terminal tab, and the terminal tab of the middle member extends therefrom in one direction and the terminal tabs of the other layers extend therefrom in the direction opposite to the terminal tab of the middle member.

18. The package of claim 17 further comprising a protective layer covering the magnetic field sensitive element and the layers.

19. In a magnetoresistor magnetic circuit which includes an exciter having teeth spaced apart by slots and a magnetoresistor sensor package having a magnetoresistor element mounted over the exciter with the exciter being movable across the magnetoresistor element, the improvement comprising:

a permanent magnet having a planar major surface, at least two coplanar members of a magnetic and electrically conductive material, said members having opposed major faces, one face of each of which is disposed on said major surface of said magnet, said member further having corresponding edges which are in closely spaced relation to provide a narrow gap therebetween, effective to provide both means for providing a travelling wave of magnetic flux across said magnet major surface but also to provide a support and electrical terminals for a magnetic field sensitive element to be disposed on at least one of said members;

a terminal tab integral with and extending from each of the members;

a magnetoresistor element mounted on an outer face of at least one of said members, said magnetoresistor element having an active region of a magnetoresistor material and spaced contacts on the active region;

means electrically connecting each of the contacts to a separate one of the members; and a permanent magnet secured to and insulated from a face of the members opposite that on which the magnetoresistor element is disposed.

20. The magnetoresistor magnetic circuit of claim 19 in which the magnetoresistor sensor package is mounted over the exciter with the magnetoresistor element facing the exciter.

21. The magnetoresistor magnetic circuit of claim 20 in which the magnetoresistor sensor package is mounted with the gap between the members extending along the direction of movement of the exciter.

22. The magnetoresistor magnetic circuit of claim 21 in which the magnetoresistor element extends across the gap between the members and is seated on both of said members.

23. The magnetoresistor magnetic circuit of claim 22 in which the magnetoresistor element is narrow and has a length substantially greater than its width and the width of the gap between the layers.

24. A lead frame for a magnetic field sensitive element package comprising an elongated strip of a ferromagnetic material having spaced parallel side strips, a plurality of square areas arranged in spaced relation between and parallel to the side strips, opposed connecting second strips extending between the square areas and the side strips for supporting the square areas between the side strips and for providing integral opposed tabs on said square areas, and a narrow slit in each square area extending parallel to the side strips for electrically separating said square area into two parts.

25. The lead frame of claim 24 further comprising additional connecting strips extending between adjacent square areas and the slits extend into the additional connecting strips.

26. A lead frame for a magnetic field sensitive element package comprising an elongated flat strip of a ferromagnetic material having spaced, parallel side strips, and a plurality of groups of three spaced, parallel second strips extending between and connected to the side strips, the middle strip of each group of second strips having opposed edges which are in closely space relation to an adjacent edge of the other two second strips so as to form narrow gaps between the strips.

27. The lead frame of claim 26 in which each of the second strips has one end directly connected to one of the side strips and a narrow connecting strip connecting the other end of the strip to the other side strip.

28. The lead frame of claim 27 further comprising additional connecting strips connecting the outer strip of each group to an outer strip of an adjacent group.

* * * * *